United States Patent [19]

Morlec et al.

[11] 4,336,423
[45] Jun. 22, 1982

[54] DEVICE FOR INCREASING THE PARALLEL INDUCTANCE OF A TRANSFORMER

[75] Inventors: Emile Morlec, Cros de Cagnes; Daniel Reynes, Villeneuve Loubet; Jean-Pierre Suzzoni, Cros de Cagnes, all of France

[73] Assignee: International Business Machines Corp., Armonk, N.Y.

[21] Appl. No.: 167,573

[22] Filed: Jul. 10, 1980

[30] Foreign Application Priority Data

Jul. 20, 1979 [FR] France ................................ 79 19131

[51] Int. Cl.³ .......................... H04B 3/30; H04B 3/36; H04Q 3/52
[52] U.S. Cl. ........................... 179/18 GF; 179/170 D; 179/170 G
[58] Field of Search ......... 179/18 GF, 170 D, 170 G, 179/80, 16 F, 81 A, 16 AA; 336/155; 330/189

[56] References Cited

U.S. PATENT DOCUMENTS

| | | | |
|---|---|---|---|
| 2,946,855 | 7/1960 | Hussey | 179/18 GF |
| 3,684,975 | 8/1972 | Valfre | 330/207 P |
| 3,720,792 | 3/1973 | Resta | 179/18 GF |
| 3,816,668 | 6/1974 | Giesken | 179/18 EA |
| 3,828,281 | 8/1974 | Chambers, Jr. | 333/17 |
| 3,927,280 | 12/1975 | Gupta et al. | 179/170 G |
| 3,993,880 | 11/1976 | O'Neill | 179/170 D |
| 4,015,190 | 3/1977 | Gasser et al. | 179/18 GF X |

Primary Examiner—Thomas W. Brown
Attorney, Agent, or Firm—John B. Frisone

[57] ABSTRACT

A switching network includes electronic crosspoint switches for providing electronic connection or disconnection between two voice stations. Each station is connected to the network through a line transformer. When two stations are connected to each other, the voice path in the network includes the secondary winding of the 1st station transformer, a series of crosspoint switches, a middle junctor, a series of crosspoint switches, and the secondary winding of the 2nd station transformer. Each middle junctor includes a negative resistance circuit which introduces a negative resistance in series with the voice path, thus compensating for the series losses in the network, and two negative inductance circuits connected on both sides of the junctor in parallel with the voice path, to compensate for the parallel losses, especially those introduced by the line transformers.

10 Claims, 7 Drawing Figures

DEVICE FOR INCREASING THE PARALLEL INDUCTANCE OF A TRANSFORMER

DESCRIPTION

Technical Field

This invention relates to a device for increasing the parallel inductance of a transformer. More particularly, the invention relates to a device for increasing the parallel inductance of telephone line transformers.

It is known that in a conventional telephone set the energy imparted to the microphone by the voice of the user is applied to a hybrid transformer which transfers part thereof to the telephone line itself and the remaining part to a balancing circuit. Unless the impedance of this circuit exactly matches that of the line, part of the energy will be transferred to the telephone receiver; this is referred to as the sidetone effect. Although this transfer is necessary, it should not exceed a suitable level because, as is well known, the higher the intensity of the acoustic energy being transferred, the more softly the user will tend to speak. In order to keep this effect within reasonable limits, the characteristics of the balancing circuit are selected as a function of the impedance of the line to which the telephone set is connected. Since conventional telephone sets are generally designed to be connected to common-carrier lines and central offices or exchanges, the impedance of the balancing circuit incorporated therein is made to match that of said lines and central offices; this circuit usually consists of a resistance-capacitance network.

When a telephone set incorporating such a circuit is used in a private automatic branch exchange (PABX), the switching network of the PABX must be perfectly "transparent" if said circuit is to correctly perform its intended function. If, as frequently happens in electronic PABX's, the line transformers exhibit a low inductance, no balancing can be achieved. This difficulty may be overcome by increasing the values of the parallel inductances of the PABX.

BACKGROUND ART

A simple solution is to use a line transformer whose windings exhibit a high inductance. However, this has the disadvantage of considerably increasing the size and the cost of the transformer; this solution, therefore, is hardly compatible with present miniaturization techniques and is uneconomical.

The present invention proposes a solution that has none of these drawbacks.

DISCLOSURE OF THE INVENTION

In accordance with a first aspect of this invention, an electronic circuit or element which exhibits a negative inductance is connected in parallel with the secondary winding of the line transformer.

Since the equivalent inductance is inversely proportional to the difference between the inductance of the transformer and that of said element, the value of the inductance may be as high as desired if the selected inductance of the element is close to that of the transformer. Negative inductance elements are well known in the art and can be manufactured in such a way that they will exhibit very precise characteristics, which allows their value to be readily selected as a function of the inductance of the transformer. It is also known to fabricate small-size negative inductance elements at a reasonable cost.

In accordance with another aspect of the invention, the parallel inductance of the line transformers in a space-division switching network incorporating middle junctors can be increased by connecting the negative inductance elements in the vicinity of the junctors rather than to the secondaries of the transformers. An advantage of this arrangement is that it necessitates a significantly smaller number of negative inductance elements and thus allows the cost to be reduced still further. Also, since these elements are connected in the vicinity of the junctors, the circuits used to control the operation of the junctors can also be used to turn said elements on and off, thereby enhancing the operation of the entire network.

The foregoing and other objects, features and advantages of the invention will be apparent from the following more particular description of a preferred embodiment of the invention, as illustrated in the accompanying drawings.

Figure 1:
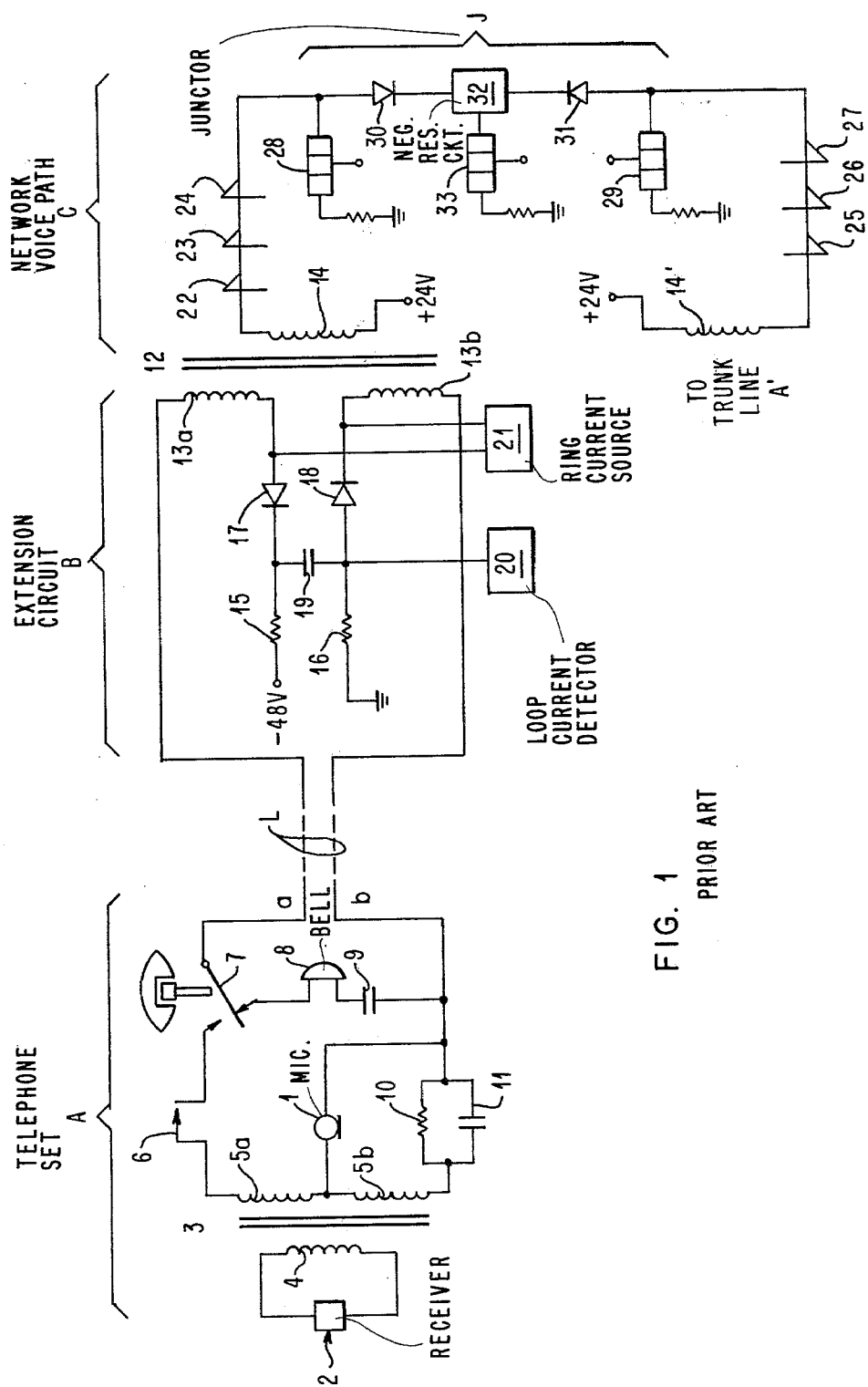
FIG. 1 is a schematic diagram of a conventional telephone line circuit and of the circuit path set up between two line transformers through a middle junctor in a switching network.

Referring now to the schematic diagram of FIG. 1, there are shown at A the basic components of a conventional telephone set; at L, the telephone line connecting the set A to a PBX; at B, an extension circuit; and at C and J, respectively, the components of the PBX switching network and of a middle junctor connecting the set A to a trunk line A' (not shown).

The telephone set A is essentially comprised of:
a microphone 1 and a receiver 2,
a transformer 3 including a primary winding 4 and two identical secondary windings 5a and 5b connected in series,
a dial contact 6,
a switch-hook 7,
a bell 8 and a capacitor associated
therewith 9, and
a balancing circuit consisting of a resistor 10 and a capacitor 11.

The voice currents from another subscriber that are transmitted via line L to the set A flow in the same direction through the windings 5a and 5b and induce a current in the winding 4. This current is converted into audible signals by the receiver 2.

However, voice currents transmitted via line L from the microphone 1 to the PBX flow in opposite directions through the windings 5a and 5b of the transformer 3. If the impedance of the balancing circuit is equal to that of the line as seen from the terminals a and b of the set A, no current is induced in the winding 4 since the currents through the windings 5a and 5b are equal and flow in opposite directions. As a result, the user does not hear his own voice in the receiver. On the other hand, if the impedances are not perfectly matched, the currents through the windings 5a and 5b are not equal and a current is induced in the winding 4. The user can then hear his own voice, more or less weakly depending on how well the circuit is balanced.

The extension circuit B is essentially comprised of:
a line transformer 12 including a primary 13, consisting of two identical windings 13a and 13b, and a secondary 14,
two feeding resistors 15 and 16,
two diodes 17 and 18,
a decoupling capacitor 19,
a −48 V supply,
a loop current detection circuit 20, and
a ringing current injection circuit 21.

When the telephone set A is on the hook, i.e., not in use, the switchhook 7 holds the loop circuit open (as shown) and no DC current flows through the circuit. However, any ringing current injected by the circuit 21 may actuate the bell 8.

On the other hand, when the set A is off the hook, i.e., when the user has picked up the handset, a DC current flows through the loop from ground to the −48 V supply via the diode 18, the winding 13b, the resistor 10, the windings 5b and 5a, the winding 13a, the diode 17 and the resistor 15. The presence or the absence of this current is detected by the circuit 20. The applicable information is transmitted by the circuit 20 to a controller (not shown) which processes same and generates suitable instructions for establishing or inhibiting connections as required.

There is schematically shown at C a path to be followed by the voice signals through the PBX switching network between the secondary 14 of the line transformer 12 associated with the telephone set A and the secondary 14' of a transformer (not shown) associated with the trunk line A' connected thereto.

In the illustrated embodiment, the switching network is of the folded type which includes several matrix stages, and whose crosspoint switches consist of controlled rectifiers (schematically shown at 22–27).

Figure 2:
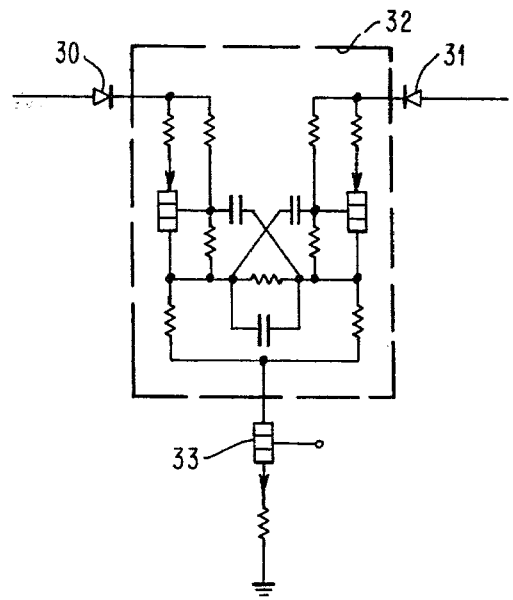
FIG. 2 shows an exemplary embodiment of the negative resistance element 32 of FIG. 1.

The middle junctor J comprises two transistors 28 and 29 acting as a current sink, two diodes 30 and 31, a circuit 32 exhibiting a negative resistance (intended to compensate for the series current losses), and a transistor 33. FIG. 2 is a detailed schematic diagram of a suitable circuit exhibiting a negative resistance.

The connection between the subscriber A and the trunk line A' is established in two steps. First, two DC current half-paths are set up from the −48 V supply to the ground of the transistors 28 and 29, respectively, by driving the bases of these transistors and the gates of the rectifiers 22–27. Then, the base of the transistor 33 is driven, thereby rendering the diodes 30 and 31 conductive and establishing a voice connection between the two half-paths.

Figure 3:
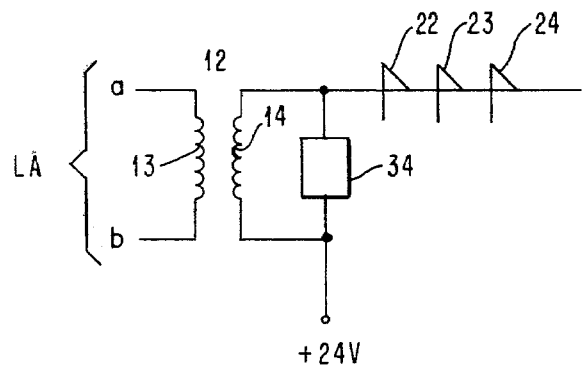
FIG. 3 is a schematic diagram of the basic device of the present invention.

In accordance with a first embodiment of the invention schematically shown in FIG. 3, a device 34 exhibiting a negative inductance is connected across the secondary winding 14 of the line transformer 12.

If the value of the inductance of the transformer 12 is designated as LP and the value of the negative inductance exhibited by the device 34 as −L, then the apparent inductance LA of the line as seen from the wires a and b will be:

$$LA = \frac{LP \times (-L)}{LP - L}$$

Thus, by using a negative inductance of appropriate value, any high value of LA can be obtained. The higher the desired value of LA, the closer to LP the absolute value of L will have to be (the selected value of L must, however, be higher than that of LP so as to obtain a positive ratio).

Figure 4:
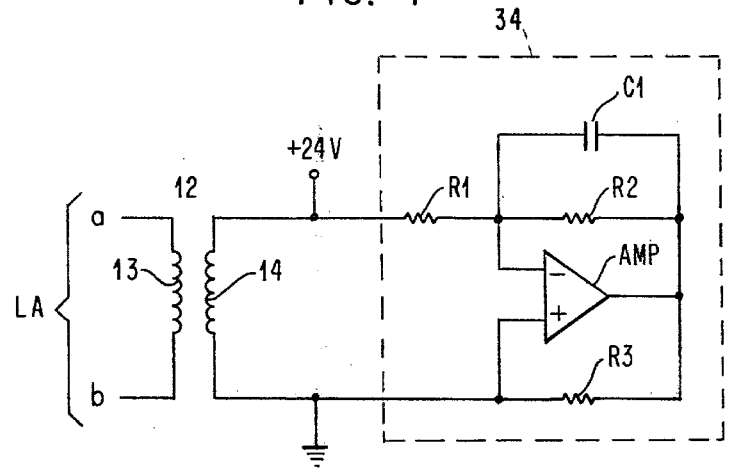
FIG. 4 is a schematic diagram of a typical negative inductance element used in the present invention.

Referring next to FIG. 4, there is shown a conventional circuit which exhibits a negative inductance and can advantageously be used in the present invention. This circuit only comprises three resistors R1, R2, R3, a capacitor C1 and an operational amplifier AMP; its size would, therefore, be very small and its cost minimal.

If we designate as LP the inductance of the transformer 12 and as LA the apparent inductance of the line as seen from the points a and b, we can write:

$$LA = \frac{LP \times (-C1 \times R1 \times R3)}{LP - (C1 \times R1 \times R3)}$$

It will be seen that, by selecting appropriate values of the elements R1, R3 and C1, the apparent inductance LA can be made to assume any high value desired. All that is required to do so is to select a value of the product C1×R1×R3 that is sufficiently close to the value of LP, but exceeds LP so that the ratio will give a positive value of LA.

Figure 5:
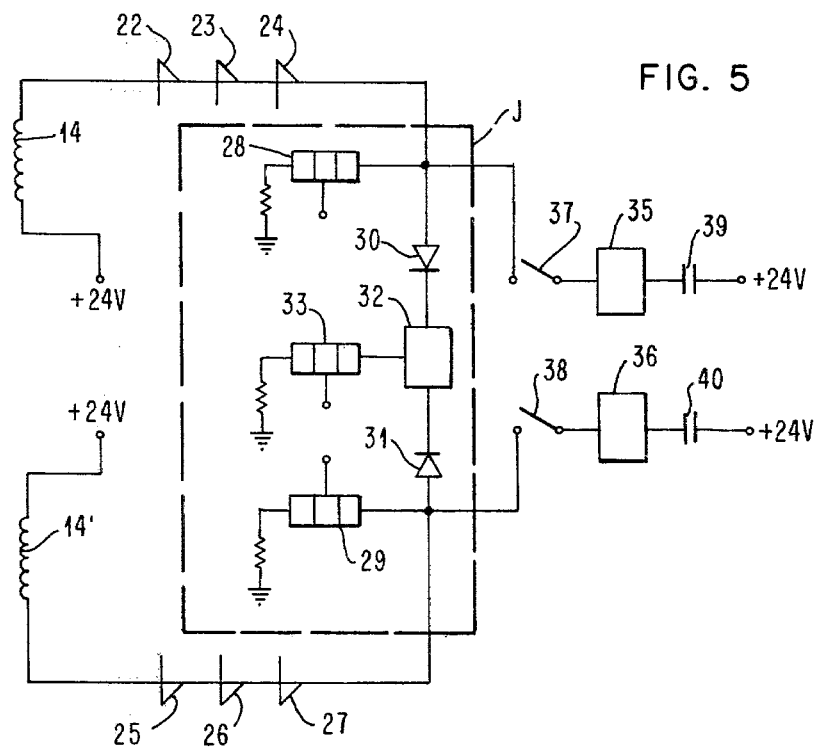
FIG. 5 shows another embodiment of the device of the present invention wherein the negative inductance elements are located in the vicinity of the middle junctors within the switching network.

Referring now to FIG. 5, another embodiment of the invention is shown. In this embodiment, instead of connecting a circuit exhibiting a negative inductance in parallel with the secondary winding of each of the line transformers, such circuits are connected in the vicinity of the junctors. This results in substantial savings since the number of junctors is much smaller than the number of line transformers. As shown in FIG. 5, negative inductance circuits 35 and 36 are respectively connected between the anodes of the diodes 30 and 31 and the +24V supply through the switches 37 and 38 and the capacitors 39 and 40. The purpose of the switches 37 and 38 is to turn the circuits 35 and 36 off when the junctor is off, so that no disturbances may be created by the circuits 35 and 36. The signals that control the switches 37 and 38 may be the same as those that control, for example, the transistors 28 and 29 or the transistor 33.

The purpose of the capacitors 39 and 40 is to prevent the DC current from flowing through the circuits 35 and 36.

The value of each of the circuits 35 and 36 is adapted to increase the parallel inductance of a line transformer in a desired manner.

Figure 6:
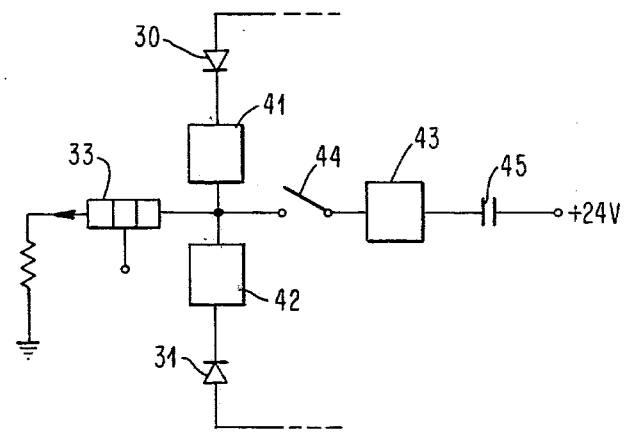
FIG. 6 shows another embodiment of the device of FIG. 5.

FIG. 6 illustrates an alternative version of the embodiment of FIG. 5 in which a single negative inductance device is used to increase the inductance of two line transformers. To this end, it is necessary to replace the negative resistance circuit 32 of FIG. 5 by two similar circuits 41 and 42, the value of each of which is half that of the circuit 32, and to connect a single circuit 43 exhibiting a negative inductance between the two circuits 41 and 42 and the +24V supply (this should preferably be done through a switch such as 44 and a capacitor such as 45). The value of the circuit 43 must, of course, be such as to increase the parallel inductance of two line transformers to the extent desired.

Figure 7:
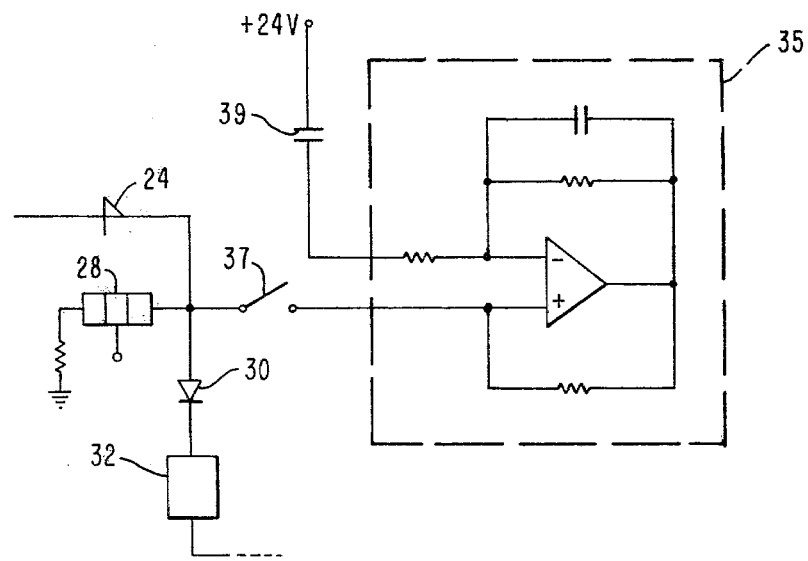
FIG. 7 shows the manner in which a negative inductance element such as that of FIG. 4 can be connected to the device of FIG. 5.

Referring now to FIG. 7, there is shown the manner in which a negative inductance circuit of the type illustrated in FIG. 4 can be connected to a device such as that of FIG. 5, which is in accordance with this invention.

While the invention has been particularly shown and described with reference to a preferred embodiment thereof, it will be understood by those skilled in the art that numerous changes in form and detail may be made therein without departing from the spirit and scope of the invention. In particular, while the present description essentially relates to telephone line transformers, the invention applies to any type of transformer. Also, it will be appreciated that, in a telephone line switching network, the negative inductance device can be connected anywhere within the network, provided it appears, after the physical connections have been made, to be connected in parallel with the secondary of the line transformer.

Having thus described our invention, what we claim as new, and desire to secure by Letters Patent is:

1. A telephone switching network for selectively connecting a plurality of telephone lines, said network including means to compensate for serial and parallel losses, comprising:
   a plurality of transformers having primary and secondary windings, said primary windings being respectively connected to said telephone lines, and said secondary windings each having a first terminal connected to a first voltage source,
   a plurality of matrices having semiconductor crosspoint switches arranged and interconnected to form said network, and to define a plurality of network inputs,
   a plurality of network outputs and a plurality of selectively controllable half voice paths between said inputs and said outputs, said inputs being respectively connected to second terminals of said transformer secondary windings,
   a plurality of controllable two-terminal junctors, said outputs being connected, in pairs, to the respective two terminals of said junctors, a first terminal of any given junctor being also connected to a second voltage source through a first switch and to a first terminal of a first diode, with the potential difference between said first voltage source and said junctor first terminal being such that the semiconductor switches of a path ending at said junctor first terminal are forward biased when said first switch is closed, the second terminal of any given junctor being similarly connected to said second voltage source through a second switch and to a first terminal of a second diode, with the potential difference between said first voltage source and said junctor second terminal being such that the semiconductor switches of a path ending at said junctor second terminal are forward biased when said second switch is closed, the second terminals of said first and second diodes being both connected to a third voltage source through two respective resistors and a single common third switch, with the potential difference between said junctor first and second terminals and said third voltage source being such that said first and second diodes are forward biased when said first, second and third switches are closed,
   a negative resistance element connected between the second terminals of each couple formed by said first and second diodes of a given junctor,
   and first and second negative inductance elements, the first one being connected between the first terminal of said first diode and said first voltage source, and the second one being connected between the first terminal of said second diode and said first voltage source.

2. A telephone switching network for selectively connecting a plurality of telephone lines, said network including means to compensate for serial and parallel losses, comprising:
   a plurality of transformers having primary and secondary windings, said primary windings being respectively connected to said telephone lines, and said secondary windings each having a first terminal connected to a first voltage source,
   a plurality of matrices having semiconductor crosspoint switches arranged and interconnected to form said network, and to define a plurality of network inputs, a plurality of network outputs and a plurality of selectively controllable half voice paths between said inputs and said outputs, said inputs being respectively connected to second terminals of said transformer secondary windings,
   a plurality of controllable two-terminal junctors, said outputs being connected, in pairs, to the respective two terminals of said junctors, a first terminal of any given junctor being also connected to a second voltage source through a first switch and to a first terminal of a first diode, with the potential difference between said first voltage source and said junctor first terminal being such that the semiconductor switches of a path ending at said junctor first terminal are forward biased when said first switch is closed, the second terminal of any given junctor being similarly connected to said second voltage source through a second switch and to a first terminal of a second diode, with the potential difference between said first voltage source and said junctor second terminal being such that the semiconductor switches of a path ending at said junctor second terminal are forward biased when said second switch is closed, the second terminals of said first and second diodes being both connected to a third voltage source through a single common third switch with the potential difference between said junctor first and second terminals and said third voltage source being such that said first and second diodes are forward biased when said first, second and third switches are closed,
   first and second negative resistance elements connected in series between the second terminal of said first diode and the second terminal of said second diode, said single common third switch being connected between the common connection point of said first and second negative resistance elements and said third voltage source, and
   a single negative inductance element connected between said common connection point and said first voltage source.

3. A network according to claim 1, wherein the value of each of said first and second negative inductance elements is so selected that, when said element is electrically connected in parallel with the secondary winding of a given one of said line transformers, said given transformer will exhibit the appropriate inductance to substantially balance the hybrid circuit of a conventional telephone set connected to said line transformer.

4. A network according to claim 2, wherein the value of said single negative inductance element is so selected that, when said single element is electrically connected in parallel with the secondary windings of two given ones of said line transformers, said given line transformers will exhibit the appropriate inductance to substantially balance the hybrid circuits of two conventional telephone sets connected to said two given line transformers.

5. A network according to claim 1 or 3, wherein a switch is interposed in each circuit which includes one of said negative inductance element.

6. A network according to claim 1 or 3, wherein a capacitor is interposed in each circuit which includes one of said negative inductance elements.

7. A network according to claim 2 or 4, wherein a switch is interposed in the circuit which includes said single negative inductance element.

8. A network according to claim 2 or 4, wherein a capacitor is interposed in the circuit which includes said single negative inductance element.

9. A network according to claim 5 wherein a capacitor is interposed in each circuit which includes one of said negative inductance elements.

10. A network according to claim 7, wherein a capacitor is interposed in the circuit which includes said single negative inductance element.

* * * * *